United States Patent
Pohl et al.

[19]

[11] Patent Number: 6,144,088

[45] Date of Patent: *Nov. 7, 2000

[54] LEADFRAME FOR SEMICONDUCTOR CHIPS AND SEMICONDUCTOR MODULE HAVING THE LEAD FRAME

[75] Inventors: Jens Pohl, Bernhardswald; Michael Blumenauer; Ulrich Vidal, both of Regensburg, all of Germany

[73] Assignee: Infineon Technologies AG, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/898,734

[22] Filed: Jul. 23, 1997

[30] Foreign Application Priority Data

Jul. 23, 1996 [DE] Germany .............................. 196 29 767

[51] Int. Cl.[7] .......................... H01L 23/50; H01L 23/28; H01L 23/48; H01L 29/44
[52] U.S. Cl. .......................... 257/666; 257/676; 257/696; 257/698; 257/667; 257/674; 257/670
[58] Field of Search .................................... 257/666, 667, 257/676, 787, 674, 686, 723, 696, 698

[56] References Cited

U.S. PATENT DOCUMENTS

| | | | |
|---|---|---|---|
| 5,197,183 | 3/1993 | Chia et al. ................................. | 29/827 |
| 5,381,036 | 1/1995 | Bigler et al. ............................. | 257/666 |
| 5,479,051 | 12/1995 | Waki et al. ............................... | 257/724 |
| 5,493,151 | 2/1996 | Asada et al. .............................. | 257/686 |
| 5,583,373 | 12/1996 | Tsubosaki et al. ....................... | 257/692 |
| 5,619,065 | 4/1997 | Kim ........................................... | 257/673 |
| 5,621,242 | 4/1997 | Mok et al. ................................ | 257/666 |
| 5,623,162 | 4/1997 | Kunhara .................................... | 257/666 |
| 5,637,913 | 6/1997 | Kajihara et al. ......................... | 257/666 |
| 5,744,827 | 4/1998 | Jaeng et al. .............................. | 257/692 |
| 5,750,423 | 5/1998 | Ishii ......................................... | 438/112 |
| 5,760,471 | 6/1998 | Fujisawa et al. ........................ | 257/692 |
| 5,801,439 | 9/1998 | Fujisawa et al. ........................ | 257/692 |
| 5,804,874 | 9/1998 | Ajisu et al. ............................... | 257/676 |
| 5,905,301 | 5/1999 | Ichikawa et al. ....................... | 257/676 |
| 6,043,430 | 3/2000 | Chun ........................................ | 257/672 |

FOREIGN PATENT DOCUMENTS

| | | |
|---|---|---|
| 5-102373 | 4/1993 | Japan . |
| 5-109963 | 4/1993 | Japan . |
| 5-235233 | 9/1993 | Japan . |

*Primary Examiner*—Alexander O. Williams
*Attorney, Agent, or Firm*—Herbert L. Lerner; Laurence A. Greenberg; Werner H. Stemer

[57] ABSTRACT

A leadframe for connection to a semiconductor chip, in particular a metal leadframe, includes a plurality of lead prongs and at least two raised lead surfaces. When a semiconductor module that includes the leadframe and a semiconductor chip is sheathed with plastic, the raised lead surfaces assure a uniform flow of a plastic composition in a mold cavity and thus prevent air from becoming trapped in a plastic package. The lead surfaces are preferably created by folding over tabs in the leadframe. The invention also relates to preliminary stages of the leadframe and to semiconductor components that contain the leadframe of the invention.

28 Claims, 1 Drawing Sheet

LEADFRAME FOR SEMICONDUCTOR CHIPS AND SEMICONDUCTOR MODULE HAVING THE LEAD FRAME

BACKGROUND OF THE INVENTION

Field of the Invention

The invention relates to a leadframe and in particular to a leadframe constructed in such a way that it can be sheathed with plastic in an especially advantageous way, when joined together with a semiconductor chip to make a semiconductor module. The leadframe of the invention is especially suitable as a leadframe for DRAM (Dynamic Random Access Memory) components, and in particular those with a package or housing of the TSOP-II type (Thin Small Outline Package, type II). Such packages have a plastic thickness of only about 1 mm.

The DRAM components are typically mounted according to the LOC (Lead On Chip) technique, in which the semiconductor chip is secured under the leadframe, for instance with the aid of mounting tapes (adhesive film). Since DRAM chips become smaller with each shrinking generation, it often happens that the width of the DRAM chips is markedly less than the package width, or the width of the mold cavity with the aid of which the package is produced. Relatively large voids, into which the plastic composition can penetrate unhindered, thus occur in the mold cavity on a side of the leadframe connected to the semiconductor chip, in regions around the semiconductor chip. When the mold cavity is filled with plastic composition (during molding), it is therefore often observed that the plastic composition spreads faster in the voids next to the semiconductor chip than in the regions where the semiconductor chip is located. In other words, the plastic races ahead in the peripheral regions of the mold cavity and reaches the ventilation side faster than the remainder of the front of the flowing plastic. The plastic fronts extending to the right and left of the semiconductor chip meet at the end of the mold cavity before the plastic composition has completely filled the middle portion of the package, and therefore air is trapped in the region on the ventilation side, for instance behind or above the chip. The trapped air reduces the quality and reliability of the finished component. The quality loss can be so great that the component has to be discarded.

The air inclusion cannot be eliminated by compression in the sheathing process. In order to prevent air inclusions in the production of plastic packages, three different techniques which have previously typically been used are known as the "lost cavity", "vacuum molding" and "balanced package" techniques.

In the lost cavity technique, a further cavity, the so-called lost cavity, is disposed behind the mold cavity for the package. The lost cavity serves as a receiving space for any air inclusions that occur and that are forced out of the package void by additional plastic composition. The plastic composition forced into the lost cavity is thrown away as waste, which is a disadvantage from the standpoint of expense and environmental protection. Moreover, separating the lost cavity plastic body from the desired product requires additional method steps.

In vacuum molding, the mold cavity is evacuated with a vacuum device before being filled with the plastic composition, so that the plastic flows into a practically air-free space, and air inclusions are thus prevented. That method, however, entails considerable additional expense for equipment since, for instance, an air-tight seal of the molding tool has to be achieved.

A fundamentally different method is to construct the semiconductor module to be sheathed in such a way that a uniform flow of the plastic in the mold cavity is assured, and the inclusion of air is averted. Semiconductor modules of that kind, which assure a uniform mold flow, are generally called balanced packages. Balanced packages are achieved, for instance, through the use of a particular leadframe structure and exact adaptation of the chip thickness and chip length. In the case of DRAM components or semiconductor modules in general with a narrow chip and a wide package, balanced packages cannot be achieved by conventional structural provisions (such as a shallow leadframe without embossed features, bends or the like).

SUMMARY OF THE INVENTION

It is accordingly an object of the invention to provide a leadframe for semiconductor chips, in particular a leadframe for the LOC mounting technique, which overcomes the hereinafore-mentioned disadvantages of the heretofore-known devices of this general type and which can be combined with the semiconductor chip to provide a semiconductor module that can be sheathed with a plastic package in a simple way, avoiding air inclusions. The leadframe should moreover be simple to produce and should in particular be suitable for use in DRAM memory components with a package of the TSOP-II type.

With the foregoing and other objects in view there is provided, in accordance with the invention, a leadframe for connection to a semiconductor chip, in particular a metal leadframe, comprising a plurality of lead prongs, and at least two raised lead surfaces.

The leadframe according to the invention assures that the plastic flows uniformly through the mold cavity during the molding.

The term "leadframe" should be understood in the sense of the invention to mean an individual carrier or substrate unit, which as a rule is intended to receive a semiconductor chip. Typically, for assembly, a plurality of leadframes are combined with one another into a ribbon or strip. Those ribbons or strips are also the subject of the invention. Moreover, the invention relates fundamentally to all types of leadframes, that is both those for the standard mounting technique, in which the semiconductor chip is secured on an island to the leadframe and those for the aforementioned LOC technique. The invention is especially suitable for the latter type. The invention is advantageous above all whenever semiconductor chips that are very much narrower than the package itself are to be connected to the leadframe.

In accordance with another feature of the invention, the lead surfaces are constructed in such a way that in a peripheral region that borders on at least one of two opposed sides of the leadframe, at least two lead surfaces are provided, which protrude beyond the surface of the leadframe that is intended for connection to a semiconductor chip. The lead surfaces may be disposed in such a way that they extend out of an inner region of the leadframe in the direction of the two other sides of the leadframe. However, it is also possible for the lead surfaces to extend substantially parallel to the other two sides of the leadframe.

In accordance with a further feature of the invention, the lead surfaces may be disposed in the region behind that side of the leadframe which is intended as the injection side (mold gate) during the production of the plastic package. Preferably, the lead surfaces are disposed in the region that borders the side of the leadframe opposite the mold gate.

In accordance with an added feature of the invention, especially good results can be obtained if the lead surfaces are disposed not only in the region behind the injection side but also behind the opposite side of the leadframe.

During the sheathing with plastic composition (molding), the plastic in the mold cavity meets the lead surfaces of the leadframe according to the invention, which slows down its flow in this region. The size and location of the lead surfaces are chosen in such a way that a uniform flow of plastic through the mold cavity is assured.

In accordance with a concomitant feature of the invention, the lead surfaces are so high that they are flush, at substantially the same height, with the surface of the mounted semiconductor chip remote from the leadframe. The lateral extent of the lead surfaces is selected in such a way that they prevent an unhindered advance of the plastic composition along the voids in the semiconductor chip in the mold cavity and the plastic composition flows at substantially the same speed over the entire width of the mold cavity. Therefore, the lead surfaces cover the lateral regions next to the semiconductor chip, while the access to the semiconductor chip by the plastic composition remains largely free. As a result, the plastic composition arrives approximately simultaneously at the ventilation side of the mold cavity, so that air inclusions can be averted.

Other features which are considered as characteristic for the invention are set forth in the appended claims.

Although the invention is illustrated and described herein as embodied in a leadframe for semiconductor chips and a semiconductor module having the leadframe, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
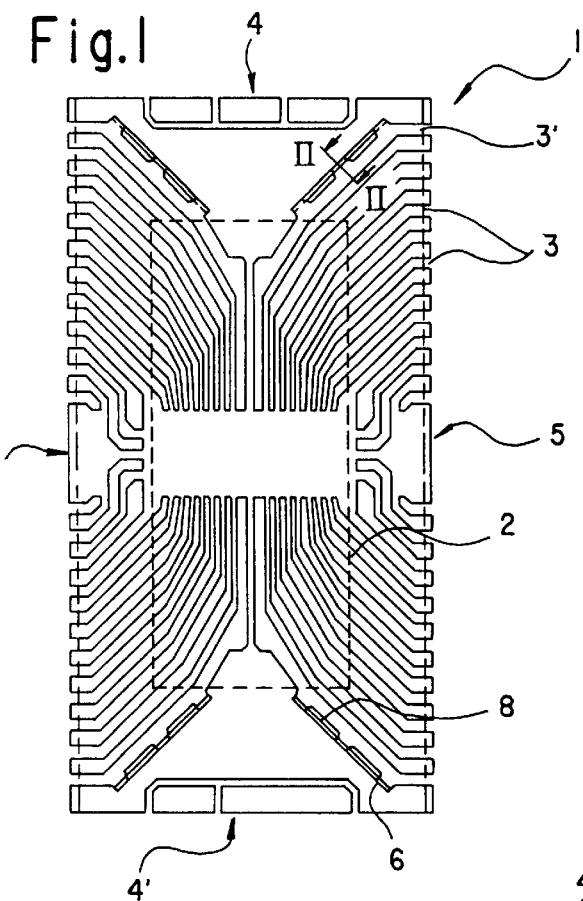
FIG. 1 is a diagrammatic, plan view of a leadframe according to the invention.

Referring now to the figures of the drawings in detail and first, particularly, to FIG. 1 thereof, there is seen a leadframe according to the invention, which is illustrated by using a leadframe 1 for the LOC mounting technique as an example. As noted, however, the invention is not limited to this type of leadframe.

The leadframe 1 has many lead prongs 3. For the sake of simplicity, guide rails, connections to other leadframes and so forth, that are removed after the assembly, are not shown in the drawings. The further description of the invention given below relates to the finally mounted leadframe without guide rails, etc.

The leadframe shown in FIG. 1 has four lead surfaces 6, which are disposed in regions that adjoin two short first sides 4, 4'. The first side 4' is intended as an injection side (mold gate) during sheathing with plastic, and the first side 4 is intended as a ventilation side. In other words, during the production of the plastic package or housing, the plastic composition flows from the first side 4' toward the first side 4. The leadframe also has a pair of long second sides 5, 5', which are at right angles to the first sides 4 and 4'.

The lead surfaces 6 extend outward from an inner region of the leadframe toward the sides 5 and 5'. A middle region between the sides 5 and 5' is left free, so that the injected plastic composition can flow unhindered toward a semiconductor chip 2, which is connected to the leadframe of the invention before the plastic package is made. The rectangle indicated by reference numeral 2 in FIG. 1 indicates a location where the semiconductor chip is mounted under the leadframe of the invention.

While on one hand the plastic composition can flow unhindered toward the semiconductor chip 2, the lead surfaces 6 on the other hand are disposed in such a way that they slow down the flow of plastic composition into free spaces to the right and left next to the semiconductor chip. The location, number and size of the lead surfaces are selected in such a way that a uniform flow of plastic over the entire width of a mold cavity is attained.

Figure 3:
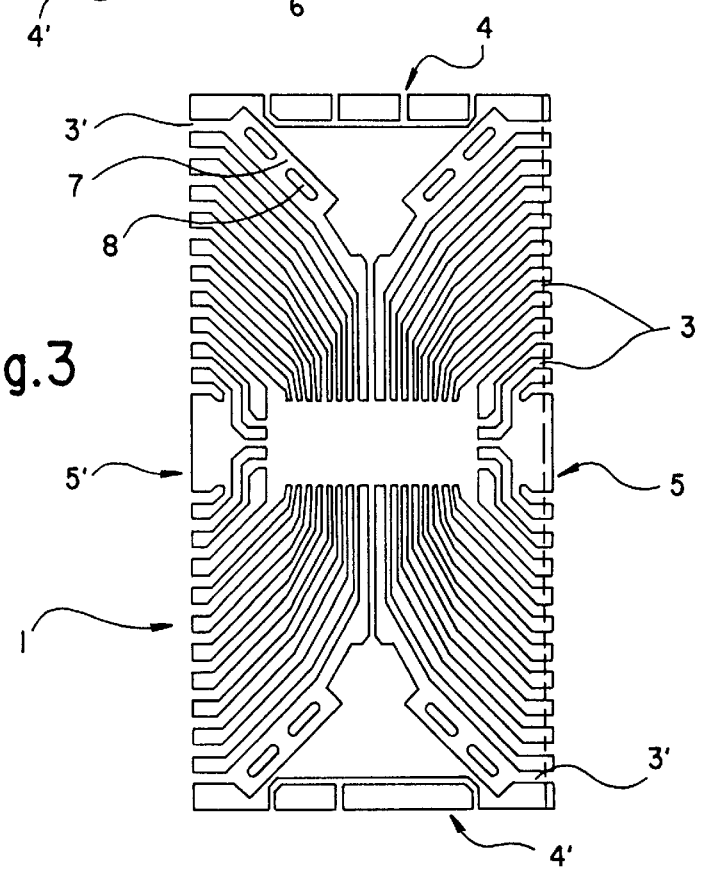
FIG. 3 is a plan view of a preliminary stage of the leadframe of the invention shown in FIG. 1.

In the present case, one lead surface 6 per free space next to the semiconductor chip is provided. The lead surfaces are connected to outer lead prongs 3', which are the lead prongs located closest to the sides 4 and 4'. In the particularly preferred embodiment shown in the drawings, the lead surfaces 6 are integrated with the outer lead prongs or corner leads 3' and are formed by folding over tabs 7 shown in FIG. 3 that extend out from the corner leads 3'. The tabs 7 may have one or more recesses 8, which are preferably located in the region of the folding edge and thus make it easier to fold over the tabs to produce the lead surfaces 6. A preliminary stage of the leadframe with the tabs 7 not folded over, that is shown as an example in FIG. 3, is likewise the subject of the invention.

Figure 2:
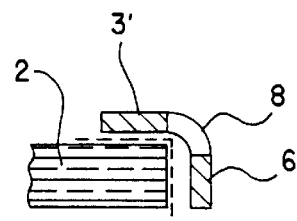
FIG. 2 is a fragmentary, cross-sectional view taken along a line II—II of FIG. 1, in the direction of the arrows.

The tabs 7 are preferably constructed in such a way that after being folded over to form the lead surfaces 6, they have substantially the same height as the semiconductor chip mounted on the leadframe of the invention. Lower edges of the lead surfaces 6 and a surface of the mounted semiconductor chip 2 facing away from the leadframe, are accordingly located substantially in the same plane. The sectional view of FIG. 2 shows this relationship diagrammatically, although the location of the chip 2 does not match its actual location in the semiconductor module.

As noted, the drawings show a particularly preferred embodiment of the invention. However, numerous other variants are possible that are also within the scope of the invention. For instance, the lead surfaces need not be constructed as a fold but can instead be secured to the surface of the leadframe that is intended to carry the semiconductor chip by adhesive bonding, soldering, welding, or in some other way. It is also not necessary to place the lead surfaces in the region of the corner leads. On the contrary, the lead surfaces can be mounted at any suitable location of the leadframe. The number, location and shape of the lead surfaces can vary and they depend, for instance, on the type of leadframe, the size and location of the semiconductor chip to be mounted, and the method employed to produce the plastic package. Fundamentally, all known methods for producing plastic packages are suitable, and all relevant plastics can be used.

Instead of using one lead surface 6 as in FIG. 1, it is also possible to use a plurality of lead surfaces, which need not necessarily be mounted at the corner leads but instead can be distributed over a plurality of lead prongs, for instance, and in that case can be staggered, for example.

As noted, the lead surfaces may also extend substantially parallel to the second sides 5, 5' of the leadframe. Such a configuration may be expedient, for instance, if the mold gate, which is the injection location for the plastic composition, is located substantially in the middle of one of the first sides 4, 4' of the leadframe. In that case, the lead surfaces are expediently disposed to the right and left of the mold gate in such a way that they slow down the flow of the plastic to the right and left into the free spaces next to the semiconductor chip.

It is also not necessary that all of the lead surfaces have the same height and/or width. On the contrary, it is possible to vary the individual parameters as a function of the demands of a particular situation, in order to achieve a uniform flow of plastic composition in the production of a plastic package and thus to prevent air from being trapped in the package.

The subject of the invention is not only the leadframe described above but also semiconductor modules, which include the leadframe of the invention and a semiconductor chip connected thereto, as well as the semiconductor modules sheathed with plastic composition, in this case especially those of the TSOP-II type.

We claim:

1. A leadframe for connection to a semiconductor chip, comprising:

a plurality of lead prongs disposed in a plane, at least two of said lead prongs each having a raised guide structure disposed in a region of said plane to be filled with a plastic composition for slowing down a flow of the plastic composition, said guide structures extending in a direction perpendicular to said plane.

2. The leadframe according to claim 1, including:

first opposed sides and second opposed sides; and a region bordering on at least one of said first sides;

at least two of said guide structures disposed at said region and extended substantially parallel to said second sides.

3. The leadframe according to claim 1, including:

first opposed sides and second opposed sides;

an inner region; and a region bordering on at least one of said first sides;

at least two of said guide structures disposed at said bordering region and extended from said inner region toward said second sides.

4. The leadframe according to claim 2, wherein two respective guide structures are disposed in each of said regions behind said two first sides.

5. The leadframe according to claim 3, wherein two respective guide structures are disposed in each of said regions behind said two first sides.

6. The leadframe according to claim 1, wherein said at least two guide structures have a height substantially equivalent to a height of a semiconductor chip mounted on the leadframe.

7. The leadframe according to claim 2, wherein one of said sides is an intended injection side for delivery of plastic composition during production of a plastic package, and said at least two guide structures are disposed in said region behind said one side.

8. The leadframe according to claim 3, wherein one of said sides is an intended injection side for delivery of plastic composition during production of a plastic package, and said at least two guide structures are disposed in said region behind said one side.

9. The leadframe according to claim 2, wherein one of said sides is an intended injection side for delivery of plastic composition during production of a plastic package, another of said sides is opposite said one side, and said at least two guide structures are disposed in said region behind said opposite side.

10. The leadframe according to claim 3, wherein one of said sides is an intended injection side for delivery of the plastic composition during production of a plastic package, another of said sides is opposite said one side, and said at least two guide structures are disposed in said region behind said opposite side.

11. The leadframe according to claim 2, including an interior, said guide structures extending so far into said interior as to define a middle region between said two second sides remaining free.

12. The leadframe according to claim 3, including an interior, said guide structures extending so far into said interior as to define a middle region between said two second sides remaining free.

13. The leadframe according to claim 2, wherein said two second sides define a center axis therebetween, and said at least two guide structures extend symmetrically with respect to said center axis.

14. The leadframe according to claim 3, wherein said two second sides define a center axis therebetween, and said at least two guide structures extend symmetrically with respect to said center axis.

15. The leadframe according to claim 1, wherein said at least two guide structures are a fold.

16. The leadframe according to claim 15, including tabs folded over to form said fold.

17. The leadframe according to claim 16, wherein said lead prongs include outer lead prongs, and said tabs are disposed on said outer lead prongs.

18. The leadframe according to claim 16, wherein said tabs have at least one recess.

19. The leadframe according to claim 16, wherein said tabs have at least one recess in the vicinity of a folding edge.

20. The leadframe according to claim 1, wherein said at least two guide structures are unfolded tabs.

21. A leadframe for connection to a semiconductor chip with the LOC mounting technique, comprising:

a plurality of lead prongs disposed in a plane, at least two of said lead prongs each having a raised guide structure disposed in a region of said plane to be filled with a plastic composition for slowing down a flow of the plastic composition, said guide structures extending in a direction perpendicular to said plane.

22. A leadframe for connection to a semiconductor chip for the production of a DRAM component, comprising:

a plurality of lead prongs disposed in a plane, at least two of said lead prongs each having a raised guide structure disposed in a region of said plane to be filled with a plastic composition for slowing down a flow of the plastic composition, said guide structures extending in a direction perpendicular to said plane.

23. A semiconductor module, comprising:

a semiconductor chip; and a leadframe connected to said semiconductor chip, said leadframe having a plurality of lead prongs disposed in a plane, at least two of said lead prongs each having a raised guide structure disposed in a region of said plane to be filled with a plastic composition for slowing down a flow of the plastic composition, said guide structures extending in a direction perpendicular to said plane.

24. A DRAM component, comprising:

a semiconductor chip; and a leadframe connected to said semiconductor chip, said leadframe having a plurality of lead prongs disposed in a plane, at least two of said lead prongs each having a raised guide structure disposed in a region of said plane to be filled with a plastic composition for slowing down a flow of the plastic composition, said guide structures extending in a direction perpendicular to said plane.

25. The semiconductor module according to claim 23, including a plastic sheathing.

26. The DRAM component according to claim 24, including a plastic sheathing.

27. The semiconductor module according to claim 23, including a housing of the TSOP-II type.

28. The DRAM component according to claim 24, including a housing of the TSOP-II type.

* * * * *